United States Patent
Wang et al.

(10) Patent No.: US 12,433,091 B2
(45) Date of Patent: Sep. 30, 2025

(54) MOLD, AND METHOD FOR ENCAPSULATING DISPLAY PANEL

(71) Applicant: BOE TECHNOLOGY GROUP CO., LTD., Beijing (CN)

(72) Inventors: Linlin Wang, Beijing (CN); Guang Yan, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 913 days.

(21) Appl. No.: 17/288,588

(22) PCT Filed: Sep. 25, 2020

(86) PCT No.: PCT/CN2020/117675
§ 371 (c)(1),
(2) Date: Apr. 26, 2021

(87) PCT Pub. No.: WO2021/063253
PCT Pub. Date: Apr. 8, 2021

(65) Prior Publication Data
US 2021/0391563 A1    Dec. 16, 2021

(30) Foreign Application Priority Data
Sep. 30, 2019  (CN) .......................... 201910939893.9

(51) Int. Cl.
*H10K 50/844* (2023.01)
*B29C 39/02* (2006.01)
(Continued)

(52) U.S. Cl.
CPC ........... *H10K 50/844* (2023.02); *B29C 39/02* (2013.01); *B29C 39/26* (2013.01); *H10K 50/84* (2023.02); *H10K 71/00* (2023.02); *H10K 59/873* (2023.02)

(58) Field of Classification Search
CPC ......... B29C 39/32; B29C 39/36; B29C 39/26; B29C 39/02–126
See application file for complete search history.

(56) References Cited

U.S. PATENT DOCUMENTS

| | | | |
|---|---|---|---|
| 8,464,450 B1* | 6/2013 | Kendall | A47G 1/12 40/737 |
| 2003/0139112 A1* | 7/2003 | Kim | H10K 50/14 445/50 |

(Continued)

FOREIGN PATENT DOCUMENTS

| | | |
|---|---|---|
| CN | 106450038 A | 2/2017 |
| CN | 106548987 A | 3/2017 |

(Continued)

OTHER PUBLICATIONS

Translation of KR-20040015505-A (Year: 2004).*

(Continued)

*Primary Examiner* — John J DeRusso
(74) *Attorney, Agent, or Firm* — Lippes Mathias LLP (57) ABSTRACT

Provided is a mold for manufacturing a display panel, including a display substrate and a barrier wall disposed on the display substrate, both the display substrate and the barrier wall being in an annular shape, and an organic layer being formed in an area enclosed by the barrier wall; wherein the mold includes: a bottom surface and a top surface disposed oppositely to each other, the bottom surface being proximal to the display substrate relative to the top surface; and wherein the mold surrounds the barrier wall, and an inner wall surface of the mold is in contact with an outer wall surface of the barrier wall, the inner wall surface of the mold being a surface of an inside of the mold and the outer wall surface of the barrier wall being a surface of an outside of the barrier wall.

16 Claims, 4 Drawing Sheets

(51) Int. Cl.
    *B29C 39/26*     (2006.01)
    *H10K 50/84*     (2023.01)
    *H10K 59/80*     (2023.01)
    *H10K 71/00*     (2023.01)

(56) References Cited

U.S. PATENT DOCUMENTS

| | | | |
|---|---|---|---|
| 2006/0076884 A1 | 4/2006 | Ahn | |
| 2013/0171410 A1* | 7/2013 | Armbruster | B29C 39/003 |
| | | | 264/331.21 |
| 2018/0085976 A1* | 3/2018 | Fan | B29C 45/40 |
| 2021/0210721 A1 | 7/2021 | Xue et al. | |

FOREIGN PATENT DOCUMENTS

| | | |
|---|---|---|
| CN | 107565066 A | 1/2018 |
| CN | 107689424 A | 2/2018 |
| CN | 207425923 U | 5/2018 |
| CN | 208298874 U | 12/2018 |
| CN | 109256486 A | 1/2019 |
| CN | 109378400 A | 2/2019 |
| CN | 109671867 A | 4/2019 |
| CN | 110277433 A | 9/2019 |
| CN | 110611050 A | 12/2019 |
| KR | 20040015505 A * | 2/2004 |

OTHER PUBLICATIONS

Zhang, Bowei et al. "Flexible packaging of solid-state integrated circuit chips with elastomeric microfluidics." Scientific Reports vol. 3 1098. Jan. 22, 2013, doi:10.1038/srep01098 (Year: 2013).*
Notification to grant patent right for invention of Chinese application No. 201910939893.9 issued on Apr. 13, 2021.

* cited by examiner

MOLD, AND METHOD FOR ENCAPSULATING DISPLAY PANEL

The present disclosure is a 371 of PCT Application No. PCT/CN2020/117675, filed on Sep. 25, 2020, which claims priority to Chinese Patent Application No. 201910939893.9, filed on Sep. 30, 2019 and entitled "MOLD, AND ENCAPSULATION METHOD FOR DISPLAY PANEL", the disclosures of which are herein incorporated by reference in its entirety.

TECHNICAL FIELD

The present disclosure relates to the field of display, and more particularly relates to a mold and a method for encapsulating a display panel.

BACKGROUND

Due to the advantages of self-luminescence, wide viewing angle, and fast response speed, organic light-emitting diode (OLED) display panels are widely used in the field of display.

SUMMARY

The present disclosure provides a mold and a method for encapsulating an OLED display panel.

According to a first aspect of the present disclosure, a mold for manufacturing a display panel is provided. The display panel includes a display substrate and a barrier wall disposed on the display substrate, both the mold and barrier wall are in an annular shape, and an organic layer is formed in an area enclosed by the barrier wall.

The mold includes a bottom surface and a top surface disposed oppositely to each other, and the bottom surface being proximal to the display substrate relative to the top surface.

In addition, the mold surrounds the barrier wall, and an inner wall surface of the mold is in contact with an outer wall surface of the barrier wall, the inner wall surface of the mold is a surface of an inside of the mold, and the outer wall surface of the barrier wall is a surface of an outside of the barrier wall.

Optionally, the mold is made of a light transmissive material.

Optionally, the inner wall surface of the mold extends towards the outer wall surface of the mold from the top surface to the bottom surface, wherein the outer wall surface of the mold is a surface of an outside of the mold.

Optionally, the outer wall surface of the mold extends towards the inner wall surface of the mold from the top surface to the bottom surface.

Optionally, an angle between the inner wall surface and the bottom surface of the mold is greater than or equal to 90 degrees and less than or equal to 120 degrees.

Optionally, the angle between the inner wall surface and the bottom surface of the mold is greater than or equal to 110 degrees.

Optionally, a height of the mold is greater than a height of the barrier wall in a direction from the top surface to the bottom surface.

Optionally, the mold further includes a holder connected to the outer wall surface of the mold and extending along a direction away from the inner wall surface of the mold.

Optionally, an axis of the holder is parallel to the bottom surface, and a distance between the axis of the holder and the bottom surface is greater than a distance threshold which is 5 cm.

Optionally, a release layer is attached to the inner wall surface of the mold, and a roughness of the release layer is less than a roughness threshold which is 0.050 μm.

Optionally, the release layer is made of a release agent and/or a parting agent.

According to a second aspect of embodiments of the present disclosure, a method for encapsulating a display panel is provided. The method for encapsulating the display panel includes:

providing a display substrate;

forming a barrier wall in an annular shape on the display substrate, wherein an inorganic thin film layer is formed in an area enclosed by the barrier wall;

forming an organic layer in the area enclosed by the barrier wall;

sleeving a mold on an exterior of the barrier wall, wherein the mold is the mold as defined in the aforesaid aspects;

baking the organic layer to cure the organic layer; and separating the mold from the barrier wall.

Optionally, prior to sleeving the mold on the exterior of the barrier wall, the method further includes:

coating a release layer on an inner wall surface of the mold, wherein a roughness of the release layer is less than a roughness threshold which is 0.050 μm.

Optionally, the release layer is made of a release agent and/or a parting agent.

Optionally, baking the organic layer includes baking the organic layer by ultraviolet rays.

Optionally, separating the mold from the barrier wall includes moving the mold along a direction from a bottom surface of the mold to a top surface of the mold.

Optionally, forming the barrier wall in the annular shape on the display substrate includes forming the barrier wall in the annular shape on the display substrate by a coating process and a photolithography process.

Optionally, forming the organic layer in the area enclosed by the barrier wall includes forming the organic layer in the area enclosed by the barrier wall by an inkjet printing process.

Optionally, the display panel is an OLED display panel.

Reference signs are given as follows:
display substrate 100; barrier wall 200; mold 300;
inner wall surface of the mold 301; outer wall surface of the mold 302; bottom surface of the mold 303; top surface of the mold 304; holder 310; release layer 320; outer wall surface of the barrier wall 201; inner wall surface of the barrier wall 202;
display region A1; Non-display region A2.

DETAILED DESCRIPTION

References are made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with embodiments of the present disclosure. Instead, they are merely examples of device and methods consistent with aspects related to embodiments of the present disclosure as recited in the appended claims.

The terms adopted in embodiments of the present disclosure only aim to describe specific embodiments, and are not intended to limit the embodiments of the present disclosure. The singular forms of "a" and "the" in embodiments of the present disclosure and the appended claims are also intended to include plural forms, unless the context clearly indicates other meanings.

It should be further understood that the term "and/or" in the specification includes any or all possible combinations of one or more of the associated items as listed. For example, A and/or B may indicate three cases where only A exists, A and B exist at the same time, and only B exists. The character "/" indicates that the relationship between the former and later associated objects is selective.

It should be further understood that the terms "first," "second," and the like used in embodiments and appended claims of the present disclosure do not denote any sequence, quantity, or importance, but are used to distinguish different components. Similarly, "one" or "a" and other similar words do not indicate a quantity limit, but indicate that there is at least one in number. Unless otherwise indicated, similar words such as "front", "rear", "lower" and/or "upper" are only for convenience of description, and are not limited to one position or one spatial orientation. The words "include", "comprise" or the like mean that the element or object preceding the word "include" or "comprise" encompasses the elements or objects and their equivalents as listed after the word "include" or "comprise", and does not exclude other elements or objects. The words "connected with", "connected to", and the like are not limited to physical or mechanical connections, but may include electrical connections regardless the connection is direct or indirect.

Generally, an encapsulating process, for example, a thin film encapsulation (TFE) process is adopted to encapsulate the display panel to prevent water and oxygen (i.e., water vapor and oxygen) from intruding into the display panel, which results in a short service life of the display panel. Encapsulating the display panel means that an encapsulating structure is provided on the display substrate included in the display panel.

Optionally, in embodiments of the present disclosure, the display panel may be an OLED display panel or a liquid crystal display panel. Moreover, the display panel described in embodiments of the present disclosure is applicable to a display device, and the display device may be a flexible display device, or other non-deformable/non-flexible display devices, such as mobile phones, computers, or watches. In following embodiments of the present disclosure, an OLED display panel is taken as an example of the display panel for description. The OLED display panel generally includes a display substrate and an encapsulating structure.

The display substrate may include an anode layer, a hole injection layer (HIL), a hole transport layer (HTL), an emitting layer (EML), an electron transport layer (ETL), a connection layer, and a cathode layer, which are sequentially laminated on the display substrate. When there is a pressure difference between the anode layer and the cathode layer, the EML emits light, thereby realizing the display.

The encapsulating structure is disposed on a side, distal from the display substrate, of the cathode layer, so as to cover the display substrate. In order to ensure effective encapsulation of the display substrate, the encapsulating structure generally includes a plurality of inorganic layers and organic layers which are arranged in a laminating fashion. The inorganic layer has good water-blocking performance and is applied to effectively prevent external water and oxygen from intruding into the display substrate. The organic layer is applied to effectively extend a permeation path of the water vapor and oxygen. In addition, flexibility of the encapsulating structure is increased due to the laminating fashion. The reason why the organic layer can effectively extend the permeation path of the water vapor and oxygen is as follows: the inorganic layer is generally provided with holes, and the water and oxygen may enter through the holes in the uppermost inorganic layer and then diverge towards all directions in the organic layer below the inorganic layer; furthermore, only when the water and oxygen diverge to the hole of the inorganic layer at the bottom, can it continue to penetrate downward. Optionally, the encapsulating structure includes a plurality of inorganic layers, and the inorganic layer proximal to the display substrate may be referred to as an inorganic thin film layer. The inorganic layer may be made of silicon nitride (SiNx), silicon oxynitride (SiONx) and/or silicon oxide (SiOx), and the organic layer may be made of synthetic resin.

However, the organic layer is generally manufactured by an ink jet printing (IJP) process, and the material forming the organic layer has a good fluidity. Thus, the organic layer is likely to overflow to edges of the display substrate during forming the organic layer by the IJP process, thereby causing the encapsulation to fail.

In the related art, in order to avoid overflow of the organic layer leading to encapsulation failure, an inorganic layer with a greater area is usually provided on the side, distal from the display substrate, of the organic layer to ensure effective coverage of the organic layer. However, in this way, the size of the non-display region will be larger, which is not conducive to the design of the narrow frame of the display panel.

Embodiments of the present disclosure provide a mold for manufacturing an OLED display panel. While manufacturing the OLED display panel with the mold, without additionally providing an inorganic layer with a larger size on the organic layer, the mold can effectively prevent the organic layer from overflowing to the edges during the encapsulation and thereby realize the effective encapsulation. That is, the mold provided by embodiments of the present disclosure can improve the encapsulating reliability on the premise of being conducive to the design of the narrow frame of the display panel.

The embodiments of the present disclosure are further illustrated in detail in combination with the accompanying drawings hereinafter. The embodiments of the present disclosure and features of the embodiments may be combined with each other in any fashion as long as they are not contradictory.

Figure 1:
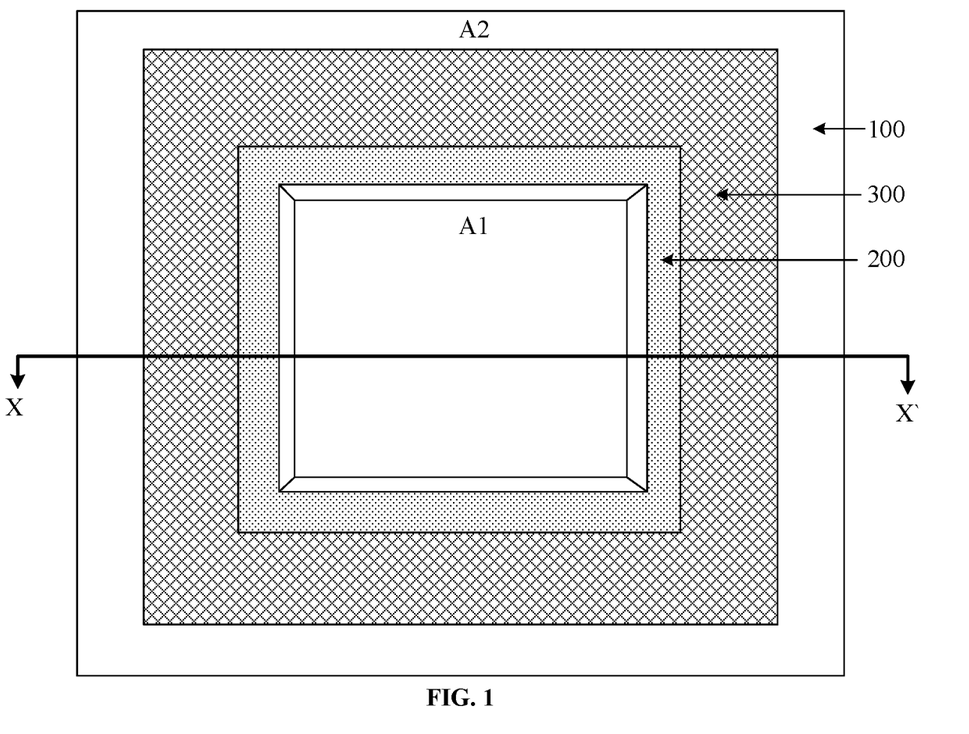
FIG. 1 is a schematic diagram of a planar structure of a display panel and a mold according to an embodiment of the present disclosure.
Figure 2:
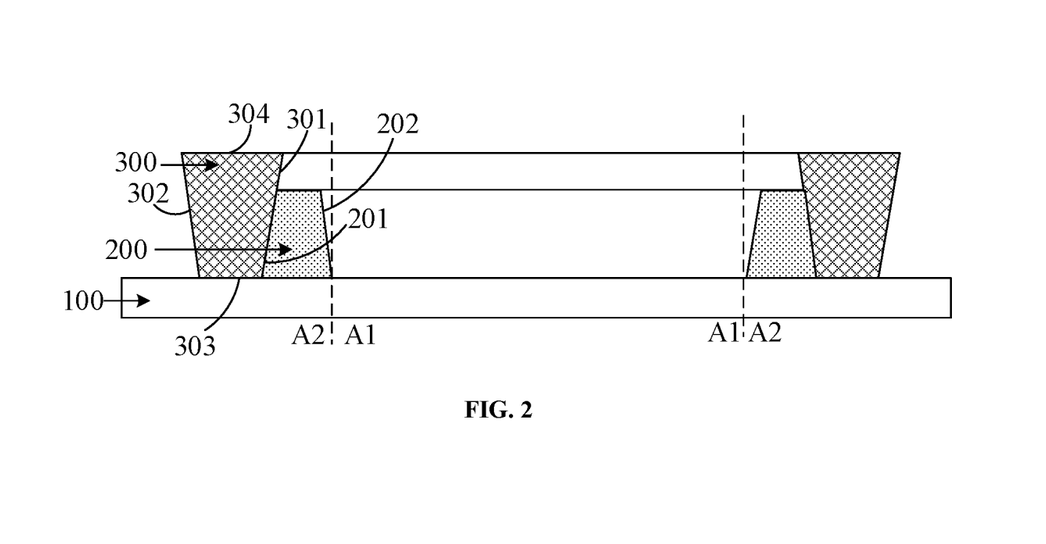
FIG. 2 is a schematic diagram of a cross-sectional structure of a display panel and a mold according to an embodiment of the present disclosure.

FIG. 1 is a schematic structural diagram of a display panel including a mold according to an embodiment of the present disclosure. FIG. 2 is a cross-sectional view of the display panel shown in FIG. 1 in the XX' direction. The mold is applicable to manufacture display panels.

With reference to FIG. 1 and FIG. 2, it can be seen that the display panel manufactured by the mold may include a display substrate 100 and a barrier wall 200 disposed on the display substrate, the barrier wall 200 is in an annular shape, and the display substrate 100 has a display region A1 and a non-display region A2.

The display substrate 100 is covered by an inorganic thin film layer (not shown in the figure), and the barrier wall 200 is disposed on a side, distal from the display substrate 100, of the inorganic thin film layer. In addition, the barrier wall 200 is disposed in the non-display region A2 of the display panel, and the organic layer of the encapsulating structure is formed in the area enclosed by the barrier wall 200, namely the display area A1. By providing the barrier wall 200, it is possible to prevent the external water vapor and oxygen from intruding into the display region of the display panel and corroding the devices (such as the cathode layer, the anode layer and the EML) inside the display region to a certain extent.

When forming the organic layer by the IJP process, the ink for forming the organic layer is printed into the display region A1, which is namely printed into the interior of the barrier wall 200. In this way, the ink drops onto the upper surface of the inorganic thin film layer and diffuses, the barrier wall 200 prevents the organic layer from overflowing to the edges (i.e., the non-display region A2) to a certain extent. However, since the barrier wall 200 cannot reliably block the overflow of the organic layer, there will still be some organic layer overflowing to the edge. Therefore, in order to further effectively prevent the ink for forming the organic layer from overflowing to the non-display region A2 and namely from overflowing to the exterior of the barrier wall 200, a detachable mold 300 may be provided on the exterior of the barrier wall 200.

In combination with the display panel shown in FIG. 2, since the barrier wall 200 is in the annular shape, the barrier wall 200 is provided with an inside and an outside. Thus, the barrier wall 200 includes an outer wall surface 201 and an inner wall surface 202 that are disposed oppositely to each other, and a bottom surface and a top surface that are disposed oppositely to each other (not shown in the figure). The outer wall surface 201 of the barrier wall 200 is a surface of the outside of the barrier wall 200, and the inner wall surface 202 of the barrier wall 200 is a surface of the inside of the barrier wall 200. In addition, in embodiments of the present disclosure further with reference to FIG. 2, the mold 300 is also in an annular shape, that is, the mold 300 is also provided with an inside and an outside. Thus, the mold 300 includes an inner wall surface 301 and an outer wall surface 302 that are disposed oppositely to each other, and a bottom surface 303 and a top surface 304 that are disposed oppositely to each other. The inner wall surface 301 is a surface of the inside of the mold 300, and the outer wall surface 302 is a surface of the outside of the mold 300. The bottom surface 303 is proximal to the display substrate 100 relative to the top surface 304. That is, the bottom surface 303 is disposed in contact with the display substrate 100.

Further with reference to FIG. 2, the mold 300 surrounds the barrier wall 200, and the inner wall surface 301 of the mold 300 is in contact with (i.e., abuts against) the outer wall surface 201 of the barrier wall 200. In this way, the organic layer overflowing to the exterior of the barrier wall 200 can be further blocked by the mold 300. That is, the mold 300 can restrict the overflow of the organic layer.

In summary, according to the mold provided by the embodiments of the present disclosure, the mold is in the annular shape, and the mold is used to surround the barrier wall and abut against the outer wall of the barrier wall. In this way, the mold can effectively restrict the organic layer in the barrier wall from overflowing, thereby realizing the effective encapsulation and improving the encapsulating reliability. Further, there is no need to provide an inorganic layer with a larger size on the organic layer to avoid overflow of the organic layer, which is conducive to the design of the narrow frame of the display panel.

Optionally, it can be seen in combination with the drawings that the effect of blocking the overflow of the organic layer is better when the inner wall surface 301 of the mold 300 is attached to the outer wall surface 201 of the barrier wall 200 and the mold 300 effectively surrounds the barrier wall 200. Therefore, in embodiments of the present disclosure with reference to another display panel shown in FIG. 3, the height H1 of the mold 300 is greater than the height H2 of the barrier wall 200 in a direction Y0 from the top surface 304 to the bottom surface 303, and the inner wall surface 301 of the mold 300 is matched with the outer wall surface 201 of the barrier wall 200. In this way, it is possible to ensure that the mold 300 effectively surrounds the barrier wall 200 and the inner wall surface 301 of the mold 300 is closely in contact with the outer wall surface 201 of the barrier wall 200.

Figure 3:
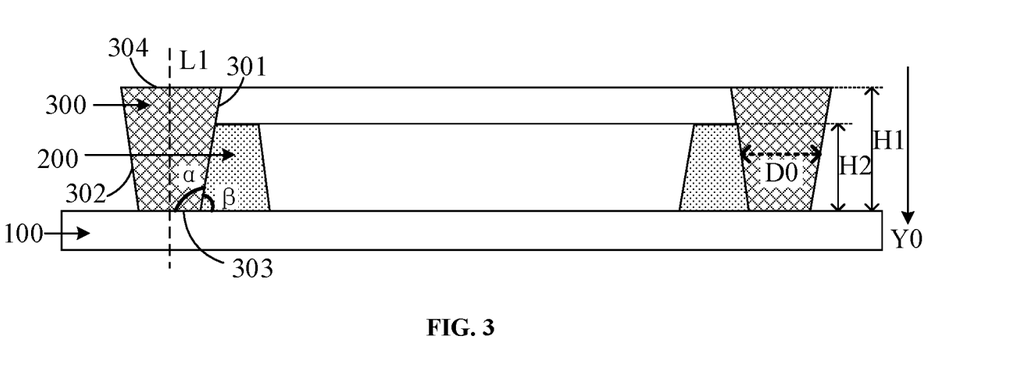
FIG. 3 is a schematic diagram of a cross-sectional structure of a display panel and a mold according to another embodiment of the present disclosure.

Optionally, further with reference to FIGS. 2 and 3, the inner wall surface 301 of the mold 300 extends toward the outer wall surface 302 of the mold 300 from the top surface 304 to the bottom surface 303. In this way, it is possible to allow the mold 300 to be conveniently spaced apart from the barrier wall 200 from bottom to top during the subsequent demolding process (i.e., separating the mold 300 from the barrier wall 200).

Optionally, further with reference to FIGS. 2 and 3, the outer wall surface 302 of the mold 300 extends toward the inner wall surface 301 of the mold 300 from the top surface 304 to the bottom surface 303. In this way, with reference to FIG. 3, the thickness D0 of the mold 300 may gradually decrease from the top surface 304 to the bottom surface 303. In this way, the mold 300 can be effectively held and be exerted an upward (that is, in a direction away from the display substrate 100) force during the subsequent demolding process, thereby facilitating the demolding operation.

Of course, the inner wall surface 301 and the outer wall surface 302 of the mold 300 may be parallel to each other. In an embodiment, the inner wall surface 301 and the outer wall surface 302 of the mold 300 are both perpendicular to the bottom surface 303. Alternatively, the inner wall surface 301 of the mold 300 is in other shapes. In this way, the separation of the mold 300 and the barrier wall 200 in the subsequent demolding process can be achieved in other fashions, such as moving the mold by a demolding device.

Optionally, in embodiments of the present disclosure further with reference to FIG. 3, the angle α between the inner wall surface 301 and the bottom surface 303 of the mold 300 is greater than or equal to 90 degrees and less than or equal to 120 degrees. That is, the angle β between the inner wall surface 301 and the display substrate 100 is greater than or equal to 60 degrees and less than or equal to 90 degrees. In this way, it is possible to effectively prevent the ink forming the organic layer from climbing along the inner wall surface 301, and to further effectively prevent the organic layer from overflowing to the edges, thereby realizing the effective encapsulation.

Of course, in order to avoid climbing and facilitate subsequent demolding process, the angle α between the inner wall surface 301 and the bottom surface 303 of the mold 300 may be greater than or equal to 110 degrees. That is, the angle β between the inner wall surface 301 and the substrate 100 may be less than or equal to 80 degrees. In this way, after the organic layer is cured, the mold 300 can be moved away conveniently from the barrier wall 200 from bottom to top, thereby achieving the demolding.

Optionally, the organic layer needs to be baked (i.e., irradiated) by ultraviolet rays to cure the organic layer after the organic layer is formed inside the barrier wall 200, and then the inorganic layer is further laid on the organic layer to form an encapsulating structure. Therefore, in order to ensure that the mold 300 blocks the ultraviolet rays, such that the organic layer can be baked by the ultraviolet rays more fully to promote the curing of the organic layer, in embodiments of the present disclosure, the mold 300 is made of a light transmissive material. For example, the mold 300 is made of a transparent material. Of course, in other embodiments, the mold 300 is made of a translucent material or other materials that allow ultraviolet rays to pass through. In addition, when the mold 300 is made of a translucent material, the top surface 304 of the mold 300 at least includes a transparent material.

Figure 4:
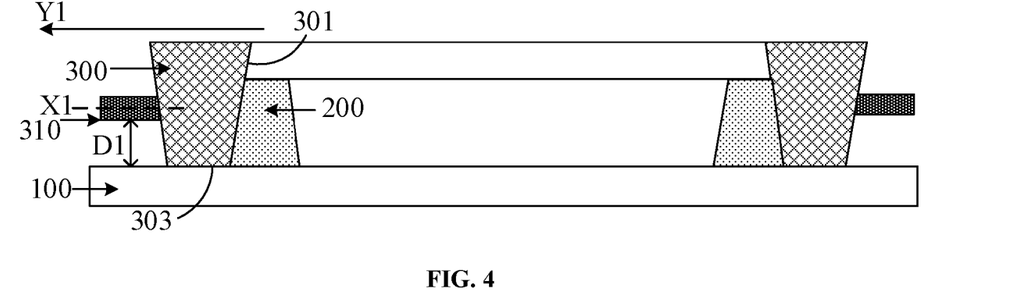
FIG. 4 is a schematic diagram of a cross-sectional structure of a display panel and a mold according to still another embodiment of the present disclosure.

Optionally, FIG. 4 is a schematic structural diagram of a display panel according to still another embodiment of the present disclosure. As shown in FIG. 4, the mold 300 further includes a holder 310. The holder 310 is connected to the outer wall surface 302 of the mold 300 and extends along the direction Y1 away from the inner wall surface 301 of the mold 300. That is, the outer wall surface 302 of the mold 300 is provided with the holder protruding outward.

Thus, while demolding the mold 300 or placing the mold 300 on the display substrate 100, the holder 310 is held to move the mold 300 away from the display substrate 100 or close to the display substrate 100. In an automated process, the provision of the holder 310 can facilitate operations of the manipulator.

In order to make it convenient for the manipulator or user to hold the lower surface of the holder 310 to move the mold 300, an axis X1 of the holder 310 is parallel to the bottom surface 303 with reference to FIG. 4, and a distance D1 between the axis X1 and the bottom surface 303 is greater than a distance threshold. That is, with reference to FIG. 3, the lower surface of the holder 310 is spaced apart from the lower surface (i.e., the bottom surface 303) of the mold 300 in the vertical direction Y0 from the top surface 304 to the bottom surface 303. That is, there is a certain gap between the lower surface of the holder 310 and the lower surface of the mold 300. Optionally, the distance threshold is 5 cm to thereby ensure an effective holding of the holder 301.

It should be noted that, in embodiments of the present disclosure, the shape of the holder 310 is not limited to the strip structure protruding outwardly as shown in FIG. 4 and may be formed of other structures such as an annular shape or a hook shape. In addition, the position of the holder 310 is not limited to the outer wall surface 302, as long as it is convenient to hold the holder 310 to move the mold 300. For example, the holder 310 may also be connected to the top surface 304. In addition, the connection between the holder 310 and the mold 300 may refer to a fixed connection (such as, welding) or a detachable connection (e.g., a connection by a tool such as a bolt), which is not limited in embodiments of the present disclosure.

It should be noted that the mold 300 may be a ring-shaped body connected end to end, and the head end and the tail end of the mold 300 are connected detachably, such that there is no need to provide the holder 310. When it is necessary to sleeve the mold 300 on the exterior of the barrier wall 200, the head end and the tail end of the mold 300 are directly connected to form an annular structure and surround the exterior of the barrier wall 200. When the mold 300 and the barrier wall 200 need to be separated (that is, when the mold needs to be demolded), the head end and the tail end of the mold 300 are directly separated to form a strip-like structure, such that the mold 300 are moved away from the barrier wall 200 to realize the demolding operation.

Figure 5:
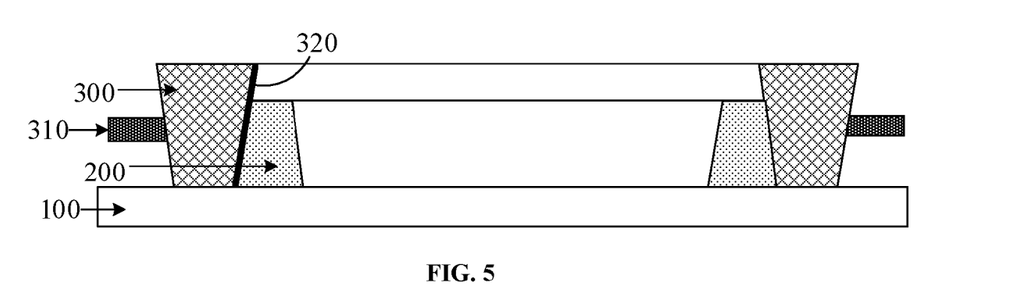
FIG. 5 is a schematic diagram of a cross-sectional structure of a display panel and a mold according to yet another embodiment of the present disclosure.

Optionally, FIG. 5 is a schematic structural diagram of a display panel according to yet another embodiment of the present disclosure. In embodiments of the present disclosure as shown in FIG. 5, the inner wall surface 301 of the mold 300 is attached with a release layer 320, and the roughness of the release layer 320 is less than the roughness threshold. For example, the release layer 320 may have a smooth surface.

Optionally, the roughness threshold is 0.05 μm, which ensures that the release layer 320 has a sufficiently smooth surface. Correspondingly, the contact surface between the mold 300 and the barrier wall 200 can be kept smooth and clean, such that the mold 300 and the barrier wall 200 can be easily separated during the demolding. For example, the material of the release layer is a release agent and/or a parting agent.

In summary, according to the mold provided by the embodiments of the present disclosure, the mold is in the annular shape, and the mold is used to surround the barrier wall and abut against the outer wall of the barrier wall. In this way, the mold can effectively restrict the organic layer in the barrier wall from overflowing, thereby realizing the effective encapsulation and improving the encapsulating reliability. Further, there is no need to provide an inorganic layer with a larger size on the organic layer to avoid overflow of the organic layer, which is conducive to the design of the narrow frame of the display panel.

Figure 6:
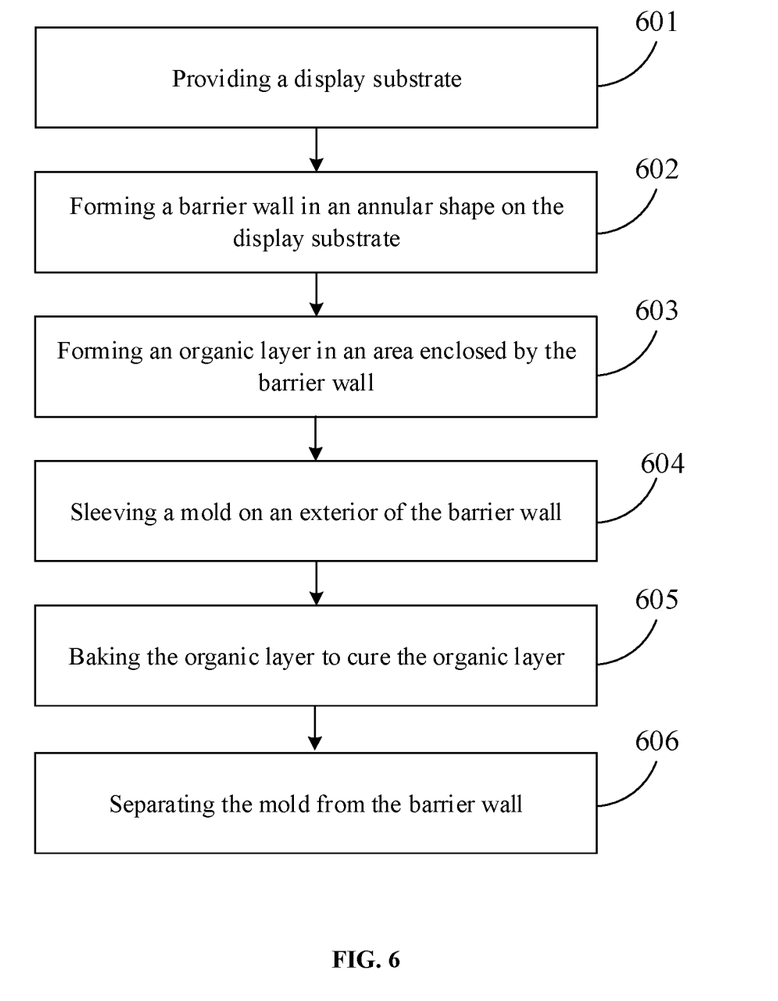
FIG. 6 is a flow-chart showing a method for encapsulating a display panel according to an embodiment of the present disclosure.

FIG. 6 is a flowchart showing a method for encapsulating a display panel according to an embodiment of the present disclosure. The method for encapsulating the display panel is applicable to manufacture the display panel in the aforesaid embodiments. As shown in FIG. 6, the method may include following steps.

In step 601, a display substrate is provided.

In step 602, a barrier wall 200 in an annular shape is formed on the display substrate 100.

Wherein an inorganic thin film layer is formed in an area enclosed by the barrier wall 200.

In step 603, an organic layer is formed in the area enclosed by the barrier wall 200.

In step 604, the mold 300 is sleeved on the exterior of the barrier wall 200.

The mold 300 herein is a mold in the display panel shown in any one of FIGS. 1 to 5.

In step 605, the organic layer is baked to cure the organic layer.

In step 606, the mold 300 is separated from the barrier wall 200.

In summary, according to the method for encapsulating a display panel provided by the embodiment of the present disclosure, a mold in an annular shape is sleeved on an exterior of the barrier wall, and the mold can surround the barrier wall and abut against the outer wall surface of the barrier wall. In this way, the mold effectively can restrict the organic layer in the barrier wall from overflowing, thereby realizing the effective encapsulation and improving the encapsulating reliability. Further, there is no need to provide an inorganic layer with a larger size on the organic layer to avoid overflow of the organic layer, which is conducive to the design of the narrow frame of the display panel.

It should be noted that for the aforesaid step 602, the inorganic thin film layer is not limited to being formed inside the barrier wall 200, and may be simultaneously formed on the barrier wall 200 or outside the barrier wall 200. In other words, the inorganic thin film layer may be formed on the display substrate 100 first, and then the barrier wall 200 is formed on the inorganic thin film layer. Of course, it is also possible to firstly form the barrier wall 200 on the display substrate 100 and then form the inorganic thin film layer in the barrier wall 200.

Optionally, the inorganic thin film layer is formed by a plasma enhanced chemical vapor deposition (PECVD) method.

Optionally, in the step 602, the barrier wall 200 is formed on the inorganic thin film layer or the display substrate 100 by a coating process and a photolithography process. This process is not only simple, but also can match the size of the outer wall surface 201 of the barrier wall 200 with the size of the inner wall surface 301 of the mold 300, such that the edges of the mold 300 and the barrier wall 200 are aligned when the mold 300 is sleeved on the exterior of the barrier wall 200. The material of the barrier wall 200 is photoresist.

Optionally, in the step 603, the organic layer is formed inside the barrier wall 200 by an inkjet printing process. In addition, after the inkjet printing process is completed, the mold 300 is sleeved on the exterior of the barrier wall 200. In this way, the influence on the inkjet printing process caused by the mold 300 and the process of installing the mold 300 can be avoided, which thereby ensures that the ink forming the organic layer can be evenly spread over the inorganic film layer.

It should be noted that the ink forming the organic layer may diffuse while dropping on the upper surface of the inorganic thin film layer. Thus, in order to realize the anti-overflow effect of the mold 300 on the ink, the mold 300 can be sleeved on the exterior of the barrier wall 200 before the ink spreads to the barrier wall 200, which can also prevent the process of installing the mold 300 from affecting the inkjet printing process.

Figure 7:
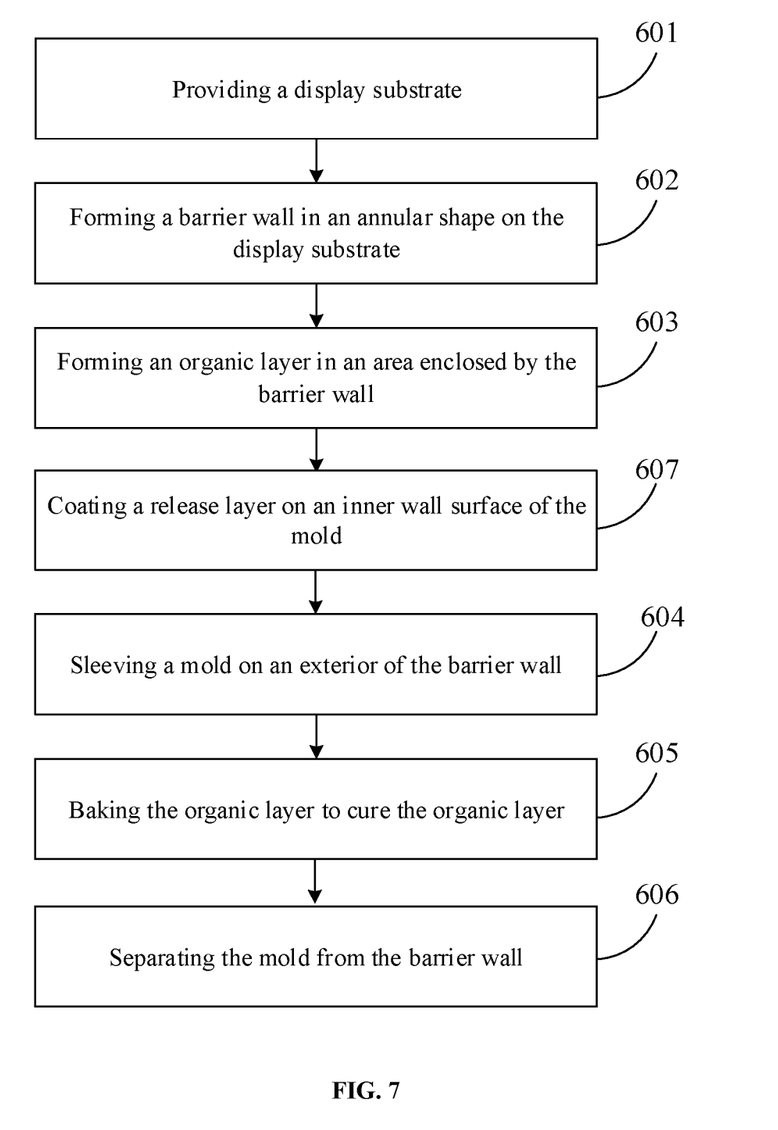
FIG. 7 is a flow-chart showing a method for encapsulating a display panel according to another embodiment of the present disclosure.

Optionally, in order to facilitate the demolding, as shown in FIG. 7, the method may further include step 607 before the step 604. In step 607, the release layer 320 is coated on the inner wall surface 301 of the mold 300.

Optionally, the roughness of the release layer 320 is less than a roughness threshold. For example, the release layer 320 has a smooth surface. In this way, the mold 300 can be easily separated from the barrier wall 200 during the demolding.

For example, the material of the release layer 320 is a release agent and/or a parting agent.

Optionally, in the step 605, the organic layer is baked by ultraviolet rays, such that the organic layer can be cured uniformly and quickly. Of course, the curing of the organic layer may also be achieved in other ways. In addition, after the organic layer is cured, the inorganic layer is continuously covered on the organic layer, and a new organic layer is continuously covered on the inorganic layer, thereby forming an encapsulating structure in which the organic layer and the inorganic layer are arranged in a laminating fashion.

Optionally, in the step 606, the mold 300 is moved along a direction from the bottom surface 303 to the top surface 304 to separate the mold 300 from the barrier wall 200.

With reference to FIG. 3, the angle between the inner wall surface 301 and the bottom surface 303 of the mold 300 is an obtuse angle, in this way, the mold 300 can be easily demolded from bottom to top and keep away from the barrier wall 200.

Optionally, the display panel is an OLED display panel, or other types of display panels, such as liquid crystal display panel.

In summary, according to the method for encapsulating a display panel provided by the embodiment of the present disclosure, a mold in an annular shape is sleeved on an exterior of the barrier wall, and the mold can surround the barrier wall and abut against the outer wall surface of the barrier wall. In this way, the mold can effectively restrict the organic layer in the barrier wall from overflowing, thereby realizing the effective encapsulation and improving the encapsulating reliability. Further, there is no need to provide an inorganic layer with a larger size on the organic layer to avoid overflow of the organic layer, which is conducive to the design of the narrow frame of the display panel.

Described above are merely exemplary embodiments of the present disclosure. Any modifications, equivalent replacements, improvements and the like made within the spirit and principles of the present disclosure should be included within the scope of protection of the present disclosure.

What is claimed is:

1. A mold for manufacturing a display panel, wherein the display panel comprises a display substrate and a barrier wall disposed on the display substrate, both the mold and the barrier wall have a rectangular cross section which has a rectangular opening at a center of the rectangular cross section, and an organic layer is formed in an area enclosed by the barrier wall;
    wherein the mold comprises a bottom surface and a top surface disposed oppositely to each other, and the bottom surface is proximal to the display substrate relative to the top surface; and
    wherein the mold surrounds the barrier wall, an inner wall surface of the mold is in contact with an outer wall surface of the barrier wall, and the inner wall surface of the mold is a surface of the rectangular opening; and
    the mold is a ring-shaped body connected end to end, and a head end and a tail end of the mold are connected detachably; and
    wherein a release layer is attached to the inner wall surface of the mold, and a roughness of the release layer is less than a roughness threshold which is 0.050 µm.

2. The mold according to claim 1, wherein the mold is made of a light transmissive material.

3. The mold according to claim 1, wherein the inner wall surface of the mold extends towards an outer wall surface of the mold from the top surface to the bottom surface.

4. The mold according to claim 3, wherein the outer wall surface of the mold extends towards the inner wall surface of the mold from the top surface to the bottom surface.

5. The mold according to claim 1, wherein an angle between the inner wall surface and the bottom surface of the mold is greater than or equal to 90 degrees and less than or equal to 120 degrees.

6. The mold according to claim 5, wherein the angle between the inner wall surface and the bottom surface of the mold is greater than or equal to 110 degrees.

7. The mold according to claim 6, wherein the mold is made of a light transmissive material, and a height of the mold is greater than a height of the barrier wall in a direction from the top surface to the bottom surface; and
the release layer is made of a release agent and/or a parting agent.

8. The mold according to claim 1, wherein a height of the mold is greater than a height of the barrier wall in a direction from the top surface to the bottom surface.

9. The mold according to claim 1, wherein the release layer is made of a release agent and/or a parting agent.

10. A method for encapsulating a display panel, wherein the display panel comprises a display substrate and a barrier wall, both a mold and the barrier wall have a rectangular cross section which has a rectangular opening at a center of the rectangular cross section, and the method comprises:
providing the display substrate;
forming the barrier wall on the display substrate, wherein an inorganic thin film layer is formed in an area enclosed by the barrier wall;
forming an organic layer in the area enclosed by the barrier wall;
sleeving the mold on an exterior of the barrier wall;
baking the organic layer to cure the organic layer; and
separating the mold from the barrier wall;

wherein the mold comprises a bottom surface and a top surface disposed oppositely to each other, and the bottom surface is proximal to the display substrate relative to the top surface; and the mold surrounds the barrier wall, an inner wall surface of the mold is in contact with an outer wall surface of the barrier wall, and the inner wall surface of the mold is a surface of the rectangular opening; and
the mold is a ring-shaped body connected end to end, and a head end and a tail end of the mold are connected detachably; and
wherein a release layer is attached to the inner wall surface of the mold, and a roughness of the release layer is less than a roughness threshold which is 0.050 μm.

11. The method according to claim 10, wherein prior to sleeving the mold on the exterior of the barrier wall, the method further comprises:
coating the release layer on the inner wall surface of the mold.

12. The method according to claim 11, wherein the release layer is made of a release agent and/or a parting agent.

13. The method according to claim 10, wherein baking the organic layer comprises baking the organic layer by ultraviolet rays.

14. The method according to claim 10, wherein forming the barrier wall on the display substrate comprises:
forming the barrier wall on the display substrate by a coating process and a photolithography process.

15. The method according to claim 10, wherein forming the organic layer in the area enclosed by the barrier wall comprises:
forming the organic layer in the area enclosed by the barrier wall by an inkjet printing process.

16. The method according to claim 10, wherein the display panel is an OLED display panel.

* * * * *